(12) United States Patent
Chen et al.

(10) Patent No.: US 9,894,993 B2
(45) Date of Patent: Feb. 20, 2018

(54) SLIDE RAIL AND SLIDE RAIL ASSEMBLY

(71) Applicants: KING SLIDE WORKS CO., LTD., Kaohsiung (TW); KING SLIDE TECHNOLOGY CO.,LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO.,LTD., Kaohsiung (TW)

( * ) Notice: Subject to any disclaimer, the term of this patent is extended or adjusted under 35 U.S.C. 154(b) by 0 days.

(21) Appl. No.: 15/294,785

(22) Filed: Oct. 17, 2016

(65) Prior Publication Data
US 2017/0340111 A1    Nov. 30, 2017

(30) Foreign Application Priority Data

May 31, 2016 (TW) .............................. 105117124 A

(51) Int. Cl.
*F16C 29/04* (2006.01)
*A47B 88/41* (2017.01)
*H05K 7/14* (2006.01)
*H05K 7/18* (2006.01)
(Continued)

(52) U.S. Cl.
CPC ............ *A47B 88/41* (2017.01); *F16C 29/005* (2013.01); *F16C 29/04* (2013.01); *H05K 7/1489* (2013.01); *H05K 7/183* (2013.01);

*A47B 2210/007* (2013.01); *A47B 2210/0032* (2013.01); *A47B 2210/0081* (2013.01); *F16C 2314/72* (2013.01)

(58) Field of Classification Search
CPC ...... F16C 29/005; F16C 29/04; F16C 29/048; F16C 21/00; F16C 2314/72; A47B 88/493; A47B 2210/32; A47B 2210/35; A47B 2210/007; A47B 2210/0081; H05K 7/1489; H05K 7/183
USPC ............... 384/12, 18, 19, 22–23, 35, 47, 49; 312/334.8, 334.11, 334.17, 334.33, 312/334.28
See application file for complete search history.

(56) References Cited

U.S. PATENT DOCUMENTS 4,194,793 A * 3/1980 Offermans ............... F16C 29/04
16/88
4,469,384 A * 9/1984 Fler ...................... A47B 88/493
312/333
(Continued)

FOREIGN PATENT DOCUMENTS

CN 102927126 A 2/2013
FR 2620318 A1 * 3/1989 .......... B42F 15/0094
(Continued)

*Primary Examiner* — Marcus Charles
(74) *Attorney, Agent, or Firm* — Winston Hsu

(57) ABSTRACT

A slide rail comprises a longitudinal body and a pair of longitudinal supporting structures extended from two sides of the longitudinal body. Each of the supporting structures has a U-shaped cross section and includes a first supporting arm and a second supporting arm bent relative to the first supporting arm. A ball raceway is formed on one of the first supporting arm and the second supporting arm.

13 Claims, 2 Drawing Sheets

(51) Int. Cl.
*F16C 21/00* (2006.01)
*F16C 29/00* (2006.01)

(56) References Cited

U.S. PATENT DOCUMENTS

| | | | | |
|---|---|---|---|---|
| 4,537,450 | A * | 8/1985 | Baxter | A47B 88/493 |
| | | | | 384/18 |
| 6,056,379 | A * | 5/2000 | Weng | A47B 88/493 |
| | | | | 312/334.11 |
| 6,132,020 | A | 10/2000 | Schael | |
| 6,378,968 | B1 * | 4/2002 | Weng | A47B 88/493 |
| | | | | 312/334.11 |
| 6,379,045 | B1 * | 4/2002 | Cirocco | A47B 88/493 |
| | | | | 312/334.11 |
| 6,854,816 | B2 * | 2/2005 | Milligan | A47B 88/43 |
| | | | | 312/334.11 |
| 6,986,557 | B2 * | 1/2006 | Kellenberger | A47B 88/493 |
| | | | | 312/334.11 |
| 9,155,386 | B2 * | 10/2015 | Hashemi | F16C 29/048 |
| 9,247,814 | B2 | 2/2016 | Chen | |
| 2011/0241515 | A1 * | 10/2011 | Park | A47B 88/10 |
| | | | | 312/408 |
| 2012/0087604 | A1 * | 4/2012 | Yu | H05K 7/1489 |
| | | | | 384/18 |
| 2015/0043842 | A1 * | 2/2015 | Stijns | A47B 88/14 |
| | | | | 384/18 |
| 2015/0282374 | A1 | 10/2015 | Chen | |

FOREIGN PATENT DOCUMENTS

| | | | | |
|---|---|---|---|---|
| GB | 2028109 A | * | 3/1980 | A47B 88/493 |
| JP | 2000189263 A | | 7/2000 | |
| JP | 2012241857 A | * | 12/2012 | F16C 29/04 |
| JP | 3191407 U | | 6/2014 | |
| WO | WO-2014160428 A1 | * | 10/2014 | F16C 29/048 |

* cited by examiner

SLIDE RAIL AND SLIDE RAIL ASSEMBLY

BACKGROUND OF THE INVENTION

1. Field of the Invention

The present invention relates to a slide rail and a slide rail assembly, and more particularly, to a slide rail and a slide rail assembly capable of increasing supporting capability.

2. Description of the Prior Art

A slide rail is usually used to support an apparatus, such as a drawer or a server chassis. As cloud technology keeps improving, electronic servers are widely used by enterprise users. However, according to market observation, current server chassis are getting heavier. Generally, a rack for the server is designed to meet industrial standard specifications, such that spaces for mounting the slide rails to two sides of the server are reduced.

U.S. Pat. No. 9,155,386 B2 of Hashemi et al. discloses a slim drawer slide. The case discloses a middle rail with two sides having S-shaped cross sections in order to increase strength of the slide rail. The case is provided for reference.

It is important to increase supporting capability of the slide rail and allow the slide rail to be mounted a limited space as well. According to such requirement, the present invention provides a slide rail and a slide rail assembly capable of increasing the supporting capability of the slide rail.

SUMMARY OF THE INVENTION

The present invention relates to a slide rail and a slide rail assembly having better supporting capability.

According to an embodiment of the present invention, a slide rail comprises a longitudinal body and a pair of longitudinal supporting structures extended from two sides of the longitudinal body. Each of the supporting structures has a U-shaped cross section and comprises a first supporting arm and a second supporting arm bent relative to the first supporting arm. Wherein, a ball raceway is formed on one of the first supporting arm and the second supporting arm.

According to another embodiment of the present invention, a slide rail assembly comprises a first rail, a second rail and a third rail. The first rail has a first longitudinal body, and a pair of first arms extended from two sides of the first longitudinal body. A first passage is defined by the pair of first arms and the first longitudinal body. Wherein, a first ball raceway is formed on each of the first arms and located within the first passage. The second rail is movable within the first passage of the first rail. The second rail has a second longitudinal body, and a pair of second arms extended from two sides of the second longitudinal body. A second passage is defined by the pair of second arms and the second longitudinal body. Wherein, each of the second arms has a first arm section and a second arm section, a second inner ball raceway is formed on the first arm section, and a second outer ball raceway is formed on the second arm section. The third rail is movable within the second passage of the second rail. The third rail has a third longitudinal body, and a pair of longitudinal supporting structures extended from two sides of the third longitudinal body. Each of the supporting structures comprises a first supporting arm and a second supporting arm. Wherein, a third ball raceway is formed on one of the first supporting arm and the second supporting arm to face toward the second inner ball raceway of the second rail.

Preferably, each of the supporting structures of the third rail has a substantially U-shaped cross section.

Preferably, the first supporting arm of the third rail is extended from the third longitudinal body. The third ball raceway is formed on the first supporting arm.

Preferably, the first supporting arm of the third rail is extended from the third longitudinal body. The second supporting arm is extended from the first supporting arm. The third ball raceway is formed on the second supporting arm.

Preferably, the first supporting arm of the third rail has at least one portion contacting the second supporting arm of the third rail.

Preferably, the third rail further comprises a connection part extendedly connected between the first supporting arm and the second supporting arm.

Preferably, the second arm further has a third arm section extended and bent from the second arm section.

Preferably, the third arm section is extended toward the first arm section.

Preferably, the third arm section has at least one portion contacting the first arm section.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
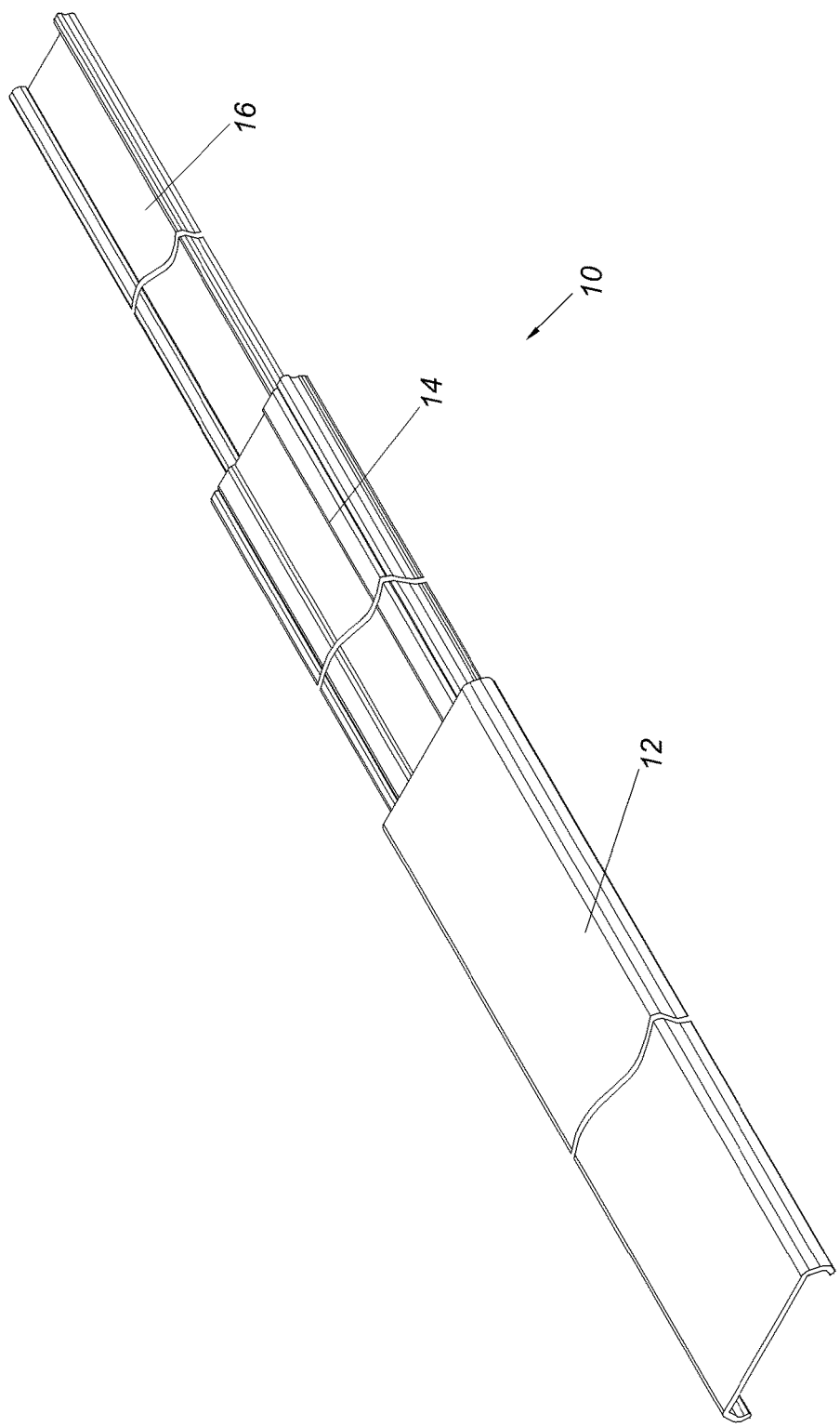
FIG. 1 is a diagram showing a slide rail assembly according to an embodiment of the present invention.
Figure 2:
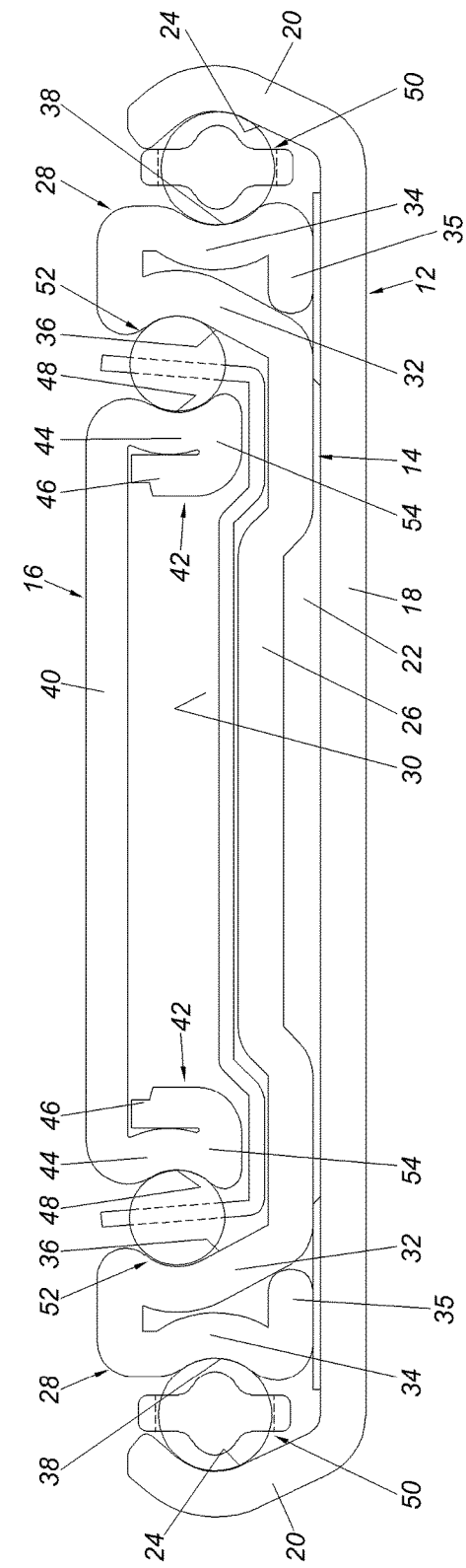
FIG. 2 is a cross-sectional view of the slide rail assembly according to an embodiment of the present invention.

FIG. 1 and FIG. 2 are diagrams showing a slide rail assembly 10 according to an embodiment of the present invention. The slide rail assembly 10 comprises a first rail 12, a second rail 14 and a third rail 16. Wherein, the first rail 12 has a first longitudinal body 18. A pair of first arms 20 are extended respectively from two sides of the first longitudinal body 18. A first passage 22 is defined by the pair of first arms 20 and the first longitudinal body 18. A first ball raceway 24 is formed on each of the first arms 20 and located within the first passage 22.

The second rail 14 is movable within the first passage 22 of the first rail 12. The second rail 14 has a second longitudinal body 26. A pair of second arms 28 are extended respectively from two sides of the second longitudinal body 26. A second passage 30 is defined by the pair of second arms 28 and the second longitudinal body 26. Wherein, each of the second arms 28 has a first arm section 32 and a second arm section 34. A second inner ball raceway 36 is formed on the first arm section 32 and located within the second passage 30. A second outer ball raceway 38 is formed on the second arm section 34 and located outside the second passage 30.

The third rail 16 (also called slide rail) is movable within the third passage 30 of the second rail 14. The third rail 16 has a third longitudinal body 40. A pair of longitudinal supporting structures 42 are extended respectively from two sides of the third longitudinal body 40. Each of the supporting structures 42 comprises a first supporting arm 44 and a second supporting arm 46. Wherein, a third ball raceway 48 is formed on the first supporting arm 44 to face toward the second inner ball raceway 36 of the second rail 14.

Preferably, the slide rail assembly 10 further comprises a first ball assembly 50 mounted between the first ball raceway 24 of the first rail 12 and the second outer ball raceway 38 of the second rail 14 for allowing the second rail 14 to be easily moved relative to the first rail 12.

Preferably, the slide rail assembly 10 further comprises a second ball assembly 52 mounted between the second inner ball raceway 36 of the second rail 14 and the third ball raceway 48 of the third rail 16 for allowing the third rail 16 to be easily moved relative to the second rail 14.

Preferably, each of the supporting structures 42 of the third rail 16 has a substantially U-shaped cross section.

Preferably, the first supporting arm 44 of the third rail 16 is extended from the third longitudinal body 40. The third ball raceway 48 is formed on the first supporting arm 44 with an arc shape.

Figure 3:
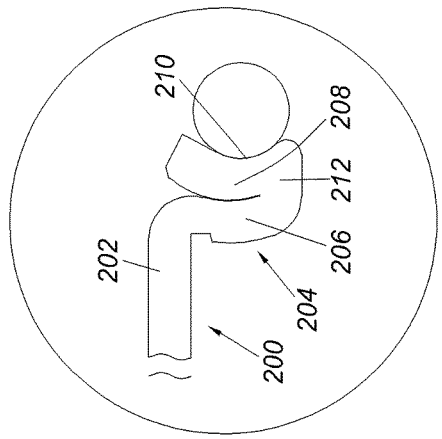
FIG. 3 is a partial cross-sectional view of a supporting structure of a slide rail of the slide rail assembly according to another embodiment of the present invention.

As shown in FIG. 3, in another embodiment of the present invention, a third rail 200 has a third longitudinal body 202. A pair of longitudinal supporting structures 204 are extended respectively from two sides of the third longitudinal body 202 (only one side is shown in the figure). Each of the supporting structures 204 comprises a first supporting arm 206 and a second supporting arm 208. Wherein, the first supporting arm 206 is extended from the third longitudinal body 202, the second supporting arm 208 is extended from the first supporting arm 206, and a third ball raceway 210 is formed on the second supporting arm 208.

Preferably, the first supporting arm 44 (or 206) of the third rail 16 (or 200) has at least one portion contacting the second supporting arm 46 (or 208) of the third rail 16 (or 200).

Preferably, the third rail 16 (or 200) further comprises a connection part 54 (or 212) extendedly connected between the first supporting arm 44 (or 206) and the second supporting arm 46 (or 208).

Preferably, the second arm 28 further has a third arm section 35 extended and bent from the second arm section 34. The third arm section 35 is extended toward the first arm section 32, and the third arm section 35 has at least one portion contacting the first arm section 32. As such, supporting capability of the slide rail assembly 10 can be further increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An innermost slide rail of a slide rail assembly, comprising:
   a longitudinal body; and
   a pair of longitudinal supporting structures extended from two sides of the longitudinal body, each of the supporting structures having a U-shaped cross section and comprising a first supporting arm and a second supporting arm bent relative to the first supporting arm, wherein the first supporting arm is extended from the longitudinal body, the second supporting arm is reversely bent relative to the first supporting arm and extended toward the longitudinal body, a ball raceway is formed on one of the first supporting arm and the second supporting arm.

2. The innermost slide rail of claim 1, wherein the ball raceway is formed on the first supporting arm.

3. The innermost slide rail of claim 1, wherein the ball raceway is formed on the second supporting arm.

4. The innermost slide rail of claim 1, wherein the first supporting arm has at least one portion contacting the second supporting arm.

5. A slide rail assembly, comprising:
   a first rail having a first longitudinal body, and a pair of first arms extended from two sides of the first longitudinal body, a first passage being defined by the pair of first arms and the first longitudinal body, wherein a first ball raceway is formed on each of the first arms and located within the first passage;
   a second rail movable within the first passage of the first rail, the second rail having a second longitudinal body, and a pair of second arms extended from two sides of the second longitudinal body, a second passage being defined by the pair of second arms and the second longitudinal body, wherein each of the second arms has a first arm section and a second arm section, a second inner ball raceway is formed on the first arm section, a second outer ball raceway is formed on the second arm section; and
   a third rail movable within the second passage of the second rail, the third rail being an innermost rail of the slide rail assembly, the third rail having a third longitudinal body, and a pair of longitudinal supporting structures extended from two sides of the third longitudinal body, each of the supporting structures comprising a first supporting arm extended from the third longitudinal body and a second supporting arm reversely bent relative to the first supporting arm and extended toward the third longitudinal body, wherein a third ball raceway is formed on one of the first supporting arm and the second supporting arm to face toward the second inner ball raceway of the second rail.

6. The slide rail assembly of claim 5, wherein each of the supporting structures of the third rail has a substantially U-shaped cross section.

7. The slide rail assembly of claim 5, wherein the third ball raceway is formed on the first supporting arm.

8. The slide rail assembly of claim 5, wherein the third ball raceway is formed on the second supporting arm.

9. The slide rail assembly of claim 5, wherein the first supporting arm of the third rail has at least one portion contacting the second supporting arm of the third rail.

10. The slide rail assembly of claim 5, wherein the third rail further comprises a connection part extendedly connected between the first supporting arm and the second supporting arm.

11. The slide rail assembly of claim 5, wherein the second arm further has a third arm section extended and bent from the second arm section.

12. The slide rail assembly of claim 11, wherein the third arm section is extended toward the first arm section.

13. The slide rail assembly of claim 11, wherein the third arm section has at least one portion contacting the first arm section.

* * * * *